United States Patent
Bounaga

Patent Number: 5,650,937
Date of Patent: Jul. 22, 1997

[54] DEVICE AND METHOD FOR MEASURING THE CHARGE STATE OF A NICKEL-CADMIUM ACCUMULATOR

[75] Inventor: Abdennebi Bounaga, Evry, France

[73] Assignee: Universite Paris Val de Marne, France

[21] Appl. No.: 503,053

[22] Filed: Jul. 17, 1995

Related U.S. Application Data

[63] Continuation of Ser. No. 240,707, May 9, 1994, abandoned.

[30] Foreign Application Priority Data

Nov. 8, 1991 [FR] France .................. 91 13790

[51] Int. Cl.[6] .................................................. G01N 27/416
[52] U.S. Cl. ................................... 364/483; 324/426
[58] Field of Search ............................ 364/483, 482; 324/426, 427, 430

[56] References Cited

U.S. PATENT DOCUMENTS

| | | | |
|---|---|---|---|
| 3,984,762 | 10/1976 | Hauser | 324/430 |
| 4,549,127 | 10/1985 | Taylor et al. | 320/21 |
| 4,644,245 | 2/1987 | Brown | 320/13 |
| 4,743,855 | 5/1988 | Randin et al. | 324/430 |
| 4,918,368 | 4/1990 | Baker et al. | 320/40 |
| 4,949,046 | 8/1990 | Seyfang | 324/427 |
| 5,093,624 | 3/1992 | Stevenson | 324/426 |
| 5,132,626 | 7/1992 | Limuti et al. | 324/432 |
| 5,144,218 | 9/1992 | Bosscha | 320/44 |
| 5,537,042 | 7/1996 | Beutler et al. | 324/432 |

*Primary Examiner*—Emanuel T. Voeltz
*Assistant Examiner*—Patrick J. Assouad
*Attorney, Agent, or Firm*—William A. Drucker

[57] ABSTRACT

The battery (3), which powers an apparatus (2), supplies an auxiliary circuit for a short time (5). A test and control component (6) of the device superimposes a low amplitude current interference $\Delta i$ onto the discharge current (1). The interference signal frequency f is chosen acccording to the capacity and the discharge current of the battery (3). Processing of the frequency response of the battery (3) by the test and control component provides an indication of the combined impedance of the battery at that frequency. The value $Z_I=(\Delta V/\Delta I) \sin (\Delta\phi)$ of the imaginary part of the impedance so measured, or advantageously the value of the quantity $\Gamma=Z_I^{-2} f^{-3/2}$ thereby indicates the state of charge of the battery.

7 Claims, 2 Drawing Sheets

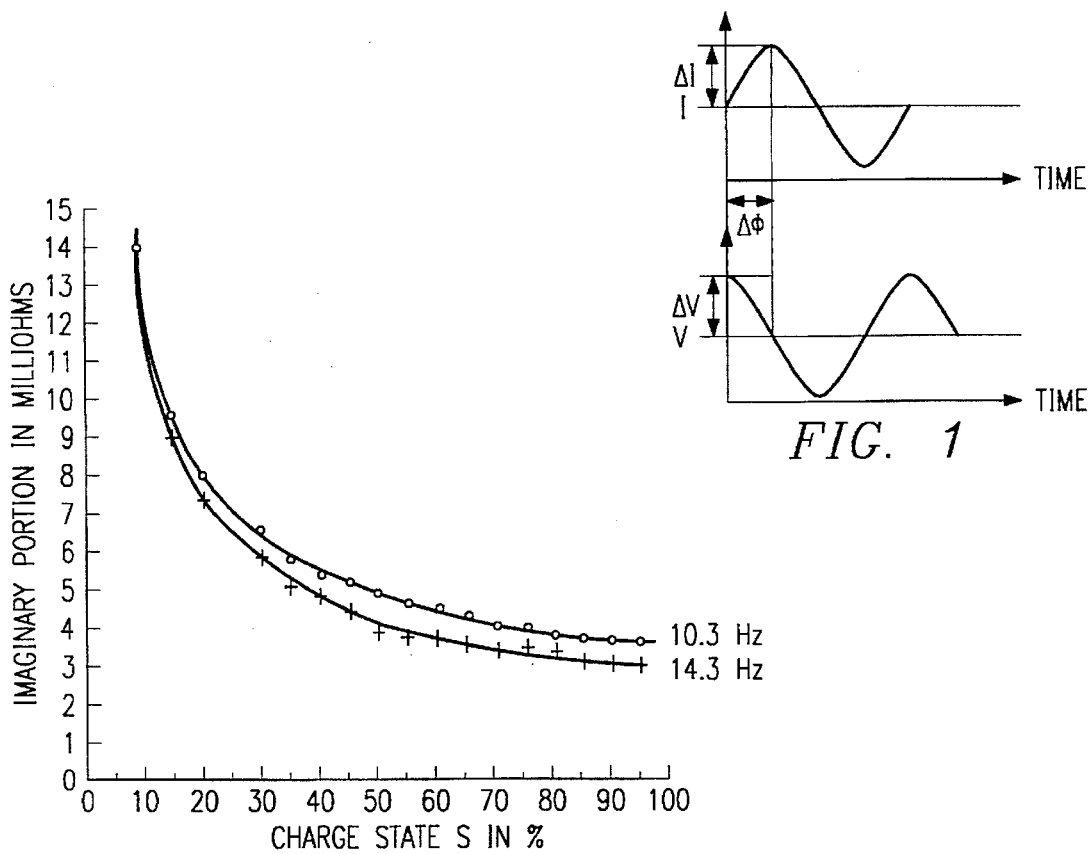
FIG. 1
FIG. 2
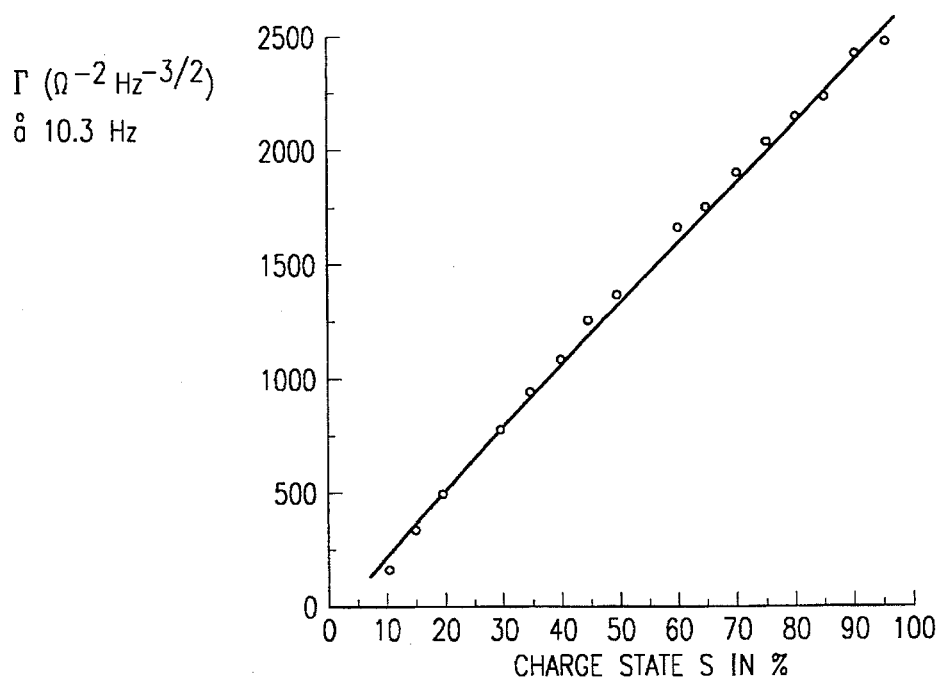
FIG. 3

DEVICE AND METHOD FOR MEASURING THE CHARGE STATE OF A NICKEL-CADMIUM ACCUMULATOR

This is a continuation of application Ser. No. 08/240,707 filed on May 9, 1994, now abandoned.

The present invention concerns a measuring method able to determine the charge state of a nickel-cadmium accumulator and a device implementing said method.

The charge state of an accumulator, a quantity denoted by S, is the ratio expressed in percentage terms between the residual capacity (amount of electricity still available in the accumulator at a given moment) and the overall or nominal capacity the accumulator is able to deliver at the end of 5 hours (or 10 or 20 hours according to the manufacturer) when it is discharged at its nominal rate from a full charge state. A knowledge of the charge state S makes it possible to firstly optimize the period of life of accumulators by limiting the charge or discharge depth at the end of each cycle, and secondly have better control of the energy available at a given moment for devices functioning on batteries.

The first methods, which have been used to obtain an indication of the charge state of an accumulator, consist of taking as a quantity representative of S the voltage at the terminals of the accumulator at a given moment during discharge. However, with a nickel-cadmium accumulator, this voltage remains virtually constant from the full charge as far as a deep discharge, this being more valid when the discharge current is weak. The use of this voltage as an indicator of the charge state S has accordingly proved to be less precise. Another variant of this method appears in the U.S. Pat. No. 4,644,245 dated February 1987 and consists of making the Nickel-Cadmium accumulator tested with a high discharge current (50 to 80 A) for an extremely short period of time of about one millisecond and of measuring the voltage at the terminals of the accumulator at the end of this period of time. The value of the voltage obtained varies considerably with the residual capacity and is used as an indicator of the charge state of the tested nickel-cadmium accumulator.

Another method forming part of stationary methods is illustrated in the European patent 67589 dated December 1982 and consists of using as a quantity representative of the charge state the voltage-current characteristic of the accumulator and comparing it with the voltage-current characteristics obtained previously at various charge states on an accumulator of the same type as the tested accumulator; however, the voltage-current characteristic depends on the value of the internal series resistance of the accumulator which is a purely ohmic quantity and which may vary from one sample to another.

As regards non-stationary methods, there is a certain number of methods which use as a quantity representative of the charge state of a battery or accumulator the value of its complex impedance measured at specific frequencies in an open circuit. For example, the method according to the patent FR 2556475 dated December 1987 uses as a quantity representative of the charge state of a battery the phase angle (a12) of the difference (Z12) between two internal impedances (Z1) and (Z2) of the battery measured at two different frequencies (f1) and (f2). This method has the advantage of removing the influence of the internal series resistance which may introduce undesirable dispersions from one battery to another. However, the measurements of the internal impedances are carried out in conditions so that the battery does not discharge any d.c. current, which requires that the voltage between the terminals of the tested battery remains stable during the measurements. Now, in the case of a nickel-cadmium accumulator which has just been discharged, there is generally a period of several hours lapsing before the voltage between its terminals stabilises, as demonstrated in the article by M. Durga Prasad and al and entitled "Open circuit voltage recovery of discharged and shorted Nickel-Cadmium cells", Journal of Applied Electrochemistry., 17 (1987), pp 463–472.

Thus, according to the method, two major drawbacks may be resolved which may appear, possibly simultaneously, the first drawback concerning the influence of the internal ohmic resistance which introduces dispersions during the measurements when moving from one sample (accumulator or battery) to another, the second drawback being the need to carry out open circuit measurements, which requires that the voltage at the terminals of the accumulator or battery stabilizes before carrying out the test.

The main object of the present invention is to provide a method for determining the charge state of a Nickel-Cadmium accumulator not having said two drawbacks mentioned above. The method of the present invention consists of discharging the tested accumulator with a constant discharge current I and of measuring the imaginary portion $Z_I$ of its complex impedance at a fixed frequency f during discharge. The imaginary portion measured at the frequency f and under the discharge current I is accordingly used in a correlation enabling the charge state of the accumulator to be determined under current I in question. The invention also concerns a device able to implement said method.

One advantage of the method of the present invention is that the imaginary portion used as a quantity allowing for access to the charge state of the accumulator under a discharge current is a quantity which does not depend on the series resistance (purely ohmic resistance) of the accumulator which thus minimizes the dispersions in the measurements when one moves from one sample (accumulator) to another. Another advantage attained by the method of the present invention is the possibility of carrying out a rapid evaluation of the charge state of the accumulator during discharge without being obliged to wait until the voltage between its terminals stabilizes, as in the case of methods using the measurement of the open circuit impedance.

When an accumulator discharges at a current I and when a low current sinusoidal disturbance with amplitude $\Delta I$ and frequency f is superimposed, the voltage at the terminals of the accumulator, initially equal to V (continuous component), has a sinusoidal variation with an amplitude $\Delta V$ and having the same frequency f as the disturbance applied, as shown on FIG. 1 on the accompanying drawing. The same figure shows the dephasing $\Delta \phi$ between the voltage at the terminals of thee accumulator and the discharge current. The complex impedance Z of the accumulator under a discharge current is obtained by measuring the quantities $\Delta I$, $\Delta V$ and $\Delta \phi$ and by using the formula:

$$Z = (\Delta V / \Delta I) \cos(\Delta \phi) + j (\Delta V / \Delta I) \sin(\Delta \phi),$$

j being a pure complex number. The impedance Z is broken down into two portions: one real resistive portion $Z = (\Delta V / \Delta I) \cos(\Delta \phi)$ including the internal series resistance of the accumulator, and an imaginary reactive portion $Z_I = (\Delta V / \Delta I) \sin(\Delta \phi)$ encompassing the capacitive phenomena. FIG. 2 on the accompanying drawing shows the variation according to the charge state of the imaginary portion $Z_I$ measured according to the present invention at two different frequencies f=10.3 Hz and f=14.3 Hz by discharging a commercial Nickel-Cadmium accumulator with a nominal capacity equal to 1.2 Ah at a rate of 300 mA. This figure demonstrates that the imaginary portion $Z_I$ of the impedance shows a significant variation for charge states lower than 50% and a less significant variation for charge states of more than 50%. Advantageously, the method of the present invention provides a quantity representative of the charge state, denoted by Γ and calculated according to the imaginary portion $Z_I$ of the impedance by the formula $Γ=Z_I^{-2} f^{-3/2}$, this quantity virtually varying linearly with the charge state of the accumulator under a discharge current. By way of example, FIG. 3 on the accompanying drawing shows the variation of Γ at 10.3 Hz according to the charge state of the same commercial Nickel-Cadmium accumulator with a nominal capacity of 1.2. Ah during discharge with a current of 300 mA. The validity of the method of the invention, irrespective of the nominal capacity or commercial origin of the Nickel-Cadmium accumulator, is ensured by adjusting three parameters:

the discharge current according to the nominal capacity of the accumulator, the frequency of the disturbing signal according to the nominal capacity and the discharge current, the value of the disturbance ΔI applied according to the discharge current.

BRIEF DESCRIPTION OF THE DRAWINGS

FIG. 1 is a graph showing current and voltage as a function of time;

FIG. 2 is a graph showing the variation according to the imaginary portion in millions as a function of charge state S in percent;

FIG. 3 is a graph showing the variation of according to the charge state of the same commercial Ni-Cd accumulator;

The device implementing the method of the present invention carries out a rapid accurate evaluation of the charge state of the Nickel-Cadmium accumulators, the specificity residing in the fact that the device uses the measurement of the complex impedance of these accumulators under a discharge current. With reference to FIG. 4, the device 4 conducts the test by making the accumulator 3 of the system 1 (device 2 fed by 3) discharge into a secondary circuit 5 for a short period. The command/control portion 6 of the device superimposes a low amplitude current disturbance on the discharge current. The frequency of the disturbing signal is selected according to the capacity and discharge current of the accumulator. The processing by the portion 6 of the frequency response of the accumulator to this disturbance makes it possible to gain access to the value of the complex impedance of the accumulator at this frequency. The value of the imaginary portion of the impedance thus measured or preferably the value of the quantity Γ defined previously then makes it possible to gain access to the charge state of the accumulator.

Figure 4:
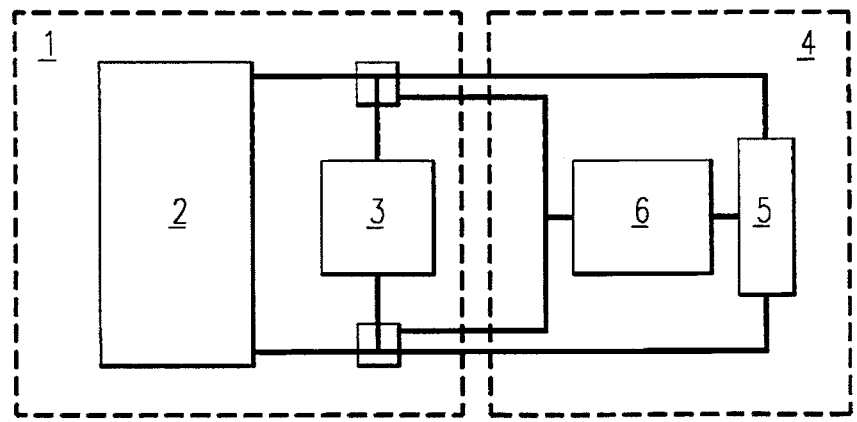
FIG. 4 is a schematic diagram of a device for measuring the charge state of a nickel-cadmium accumulator in accordance with the present invention.
Figure 5:
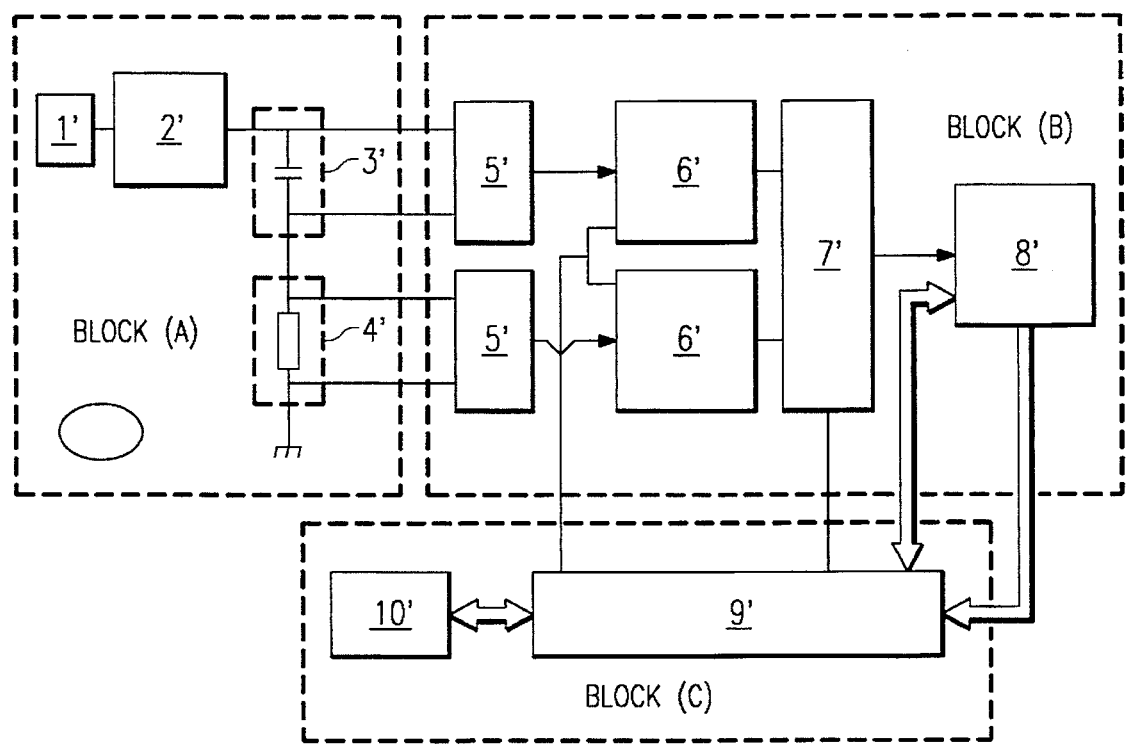
FIG. 5 is a block diagram of the device of FIG. 4.

An embodiment of the device is shown by the block diagram on FIG. 5. The device includes three blocks marked (A), (B) and (C).

The block (A) embodied conventionally enables a constant discharge current to be adjusted by superimposing on it a low amplitude current disturbance. This block includes a signal generator (1'), an intensiostatic circuit (2') able to adjust a discharge current, the tested Nickel-Cadmium accumulator (3') and a standard resistor (4') for measuring the current. The intensiostatic circuit (2') may be replaced by the user device operating on the accumulator so that the discharge current is fixed by the user device itself.

The block (B) constitutes the measuring and digital/analog conversion system; it includes (5') a signal conditioning circuit for eliminating the continuous components I and V and allows for the amplification required for the input of the lock-samplers (6'). The multiplexing of the two shaped signals is effected by (7') before being analog/digital converted by the converter (8'). According to another variant (not shown), the means (6') and (7') of the block (B) may be replaced by a single electronic component (such as the AD 630) making it possible to have an outlet proportional to the imaginary portion of the impedance from the two input signals (current and voltage).

The control and command block (C) carries out the required sequencing of the block (B) via the action of the processor (9') whose programme is housed in an internal and external memory (10'); this processor also extracts the digitalized and processed signals so as to extract the value of the charge state by means of comparison with characteristics stored in the memory (10').

According to a variant (not shown), the function of the block (C) may be replaced by a suitably programmed external control and calculation device, such as a microcomputer, a conventional parallel or series link embodying the linkage with the block (B).

According to another variant, when the apparatus using the accumulator comprises the required functions of computation and control, the three blocks are integrated with the system; this arrangement allows to automatize the checking of the state of charge.

I claim:

1. Method for measuring the charge state S of a nickel-cadmium accumulator, comprising the steps of:

(a) discharging the nickel-cadmium accumulator with a constant discharge current I;

(b) measuring the imaginary portion $Z_I$ of the complex impedance of the accumulator at a fixed frequency during discharge;

(c) using a quantity proportional to the imaginary portion $Z_I$ measured during said discharge as a parameter representative of the charge state of the accumulator, said parameter representative of the charge state being defined by $Γ=Z_I^{-2}f^{-3/2}$, where f is said fixed frequency and $Z_I$ is the imaginary portion of the complex impedance of the accumulator measured at said fixed frequency during discharge.

2. Measuring method according to claim 1 further including insuring the validity of the measuring method irrespective of the nominal capacity or commercial origin of the nickel-cadmium accumulator by the steps of adjusting:

(a) the discharge current I according to the nominal capacity of the accumulator;

(b) the frequency of a disturbing signal according to the nominal capacity and discharge current;

(c) the value of a disturbance ΔI applied according to the discharge current I.

3. Device for measuring the charge state of a nickel-cadmium accumulator, comprising:

(a) an intensiostatic circuit enabling the accumulator to be discharged under a test with a constant discharge current I and superimposing on this discharge current an alternative component at a fixed frequency;

(b) a conditioner to condition a first signal at the terminals of the accumulator, said first signal consisting of a direct tension of the accumulator and of an alternative tension and having an output terminal;

(c) a resistor serially connected to said accumulator;

(d) a second signal at the terminals of said resistor, said second signal consisting of the discharge current and of the alternative current;

(e) lock-samplers having output terminals to sample a signal at said output terminal of the conditioner;

(f) a multiplexer having an output terminal to multiplex signals at an output terminal of the lock-samplers;

(g) analog/digital converters to analog/digital convert signals at the output terminal of the multiplexer; and (h) control command means having a program housed in a memory allowing for required sequencing of the lock-samplers, of the multiplexer and of the analog/digital converters, calculation of the imaginary portion of the impedance from digitalized signals and extraction of the value of the charge state.

4. Device according to claim 3 wherein the intensiostatic circuit is a user device functioning on the accumulator so that the discharge current I is fixed by the user device itself.

5. Device according to claim 3 wherein the said lock-samplers and the multiplexer are comprised of a single electronic component making it possible to have an output proportional to the imaginary portion of the impedance from a voltage input signal and a current input signal.

6. Device according to claim 3 wherein said control command means is a suitably programmed calculation and external control device.

7. Device according to claim 3 wherein said device is integrated with the control command means of a system functioning on the accumulator.

* * * * *